United States Patent
Burrell et al.

[11] Patent Number: 5,665,000
[45] Date of Patent: Sep. 9, 1997

[54] ERGONOMIC HAND-HELD ELECTRONIC DEVICE WITH KEYPAD INPUT AND DISPLAY SCREEN

[75] Inventors: Gary L. Burrell, Lenexa; Jonathan C. Burrell, Olathe, both of Kans.

[73] Assignee: Garmin Corporation, Olathe, Kans.

[21] Appl. No.: 657,567

[22] Filed: Jun. 5, 1996

Related U.S. Application Data

[63] Continuation of Ser. No. 305,167, Sep. 13, 1994, abandoned.
[51] Int. Cl.$^6$ .................................. A63F 9/22; H02G 3/14
[52] U.S. Cl. .............................. 463/46; 463/1; 174/67; 220/200
[58] Field of Search ...................... 463/1, 30–31, 463/36, 40, 46; 174/52.3, 52.4, 54, 53, 66, 67, 50.51, 50, 50.5, 52.1; 235/61 R; 455/90; 429/163, 164, 167, 170, 171, 174, 175, 178, 179, 180; 220/200, 334, 337, 338, 523, 526

[56] References Cited

U.S. PATENT DOCUMENTS

| | | | |
|---|---|---|---|
| 1,638,716 | 8/1927 | Surles | 362/208 |
| 3,130,970 | 4/1964 | Hutsell | 273/85 |
| 3,583,149 | 6/1971 | Ganter | 58/23 |
| 4,050,798 | 9/1977 | Boggs | 353/35 |
| 4,969,647 | 11/1990 | Mical et al. | 273/85 |
| 5,103,377 | 4/1992 | Kobayashi et al. | 361/394 |
| 5,184,830 | 2/1993 | Okada et al. | 273/433 |
| 5,246,790 | 9/1993 | Mooney et al. | 429/7 |
| 5,333,116 | 7/1994 | Hawkins et al. | 364/708 |
| 5,358,135 | 10/1994 | Robbins et al. | 220/337 |
| 5,434,789 | 7/1995 | Fraker et al. | 364/460 |

*Primary Examiner*—Jessica Harrison
*Assistant Examiner*—Mark A. Sager
*Attorney, Agent, or Firm*—Kokjer, Kircher, Bowman & Johnson

[57] ABSTRACT

An ergonomic and weatherproof hand-held electronic device 10. The device 10 includes a housing 12 which surrounds internal electronics. An input 28 and a display screen 32 are mounted on the housing 12. The housing 12 is has a narrow width such that, when held in a hand, the thumb of that same hand may extend fully across the input 28 for full access. The display screen 32 is mounted vertically below the input 28 such that the device may be more stable and more easily grasped. The device includes two cylindrical cavities 48 to receive batteries 42. The cavities 48 are located at the rear vertical edges of the housing such that the rear of the housing 12 is relatively rounded and thus easier to grasp. The battery cavities open to the exterior of the housing. A battery cover 54 is mounted to the housing and seals the cavities 48. A contact for each cavity 48 is located on the cover, and a bus bar extends between the contacts to complete the circuit between the batteries 42.

2 Claims, 2 Drawing Sheets

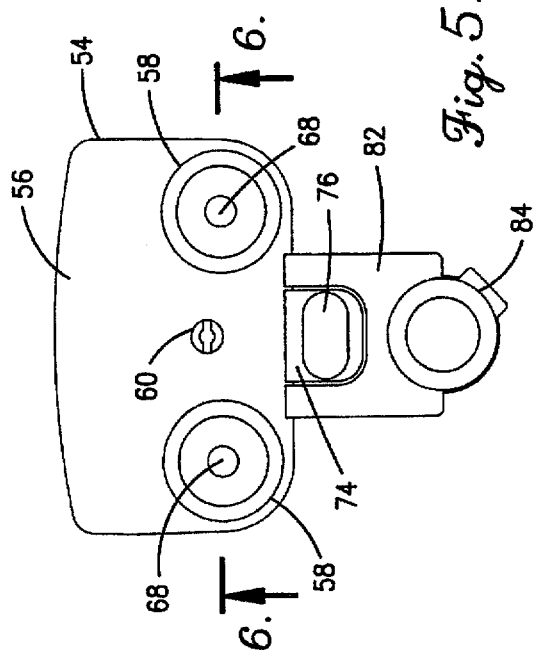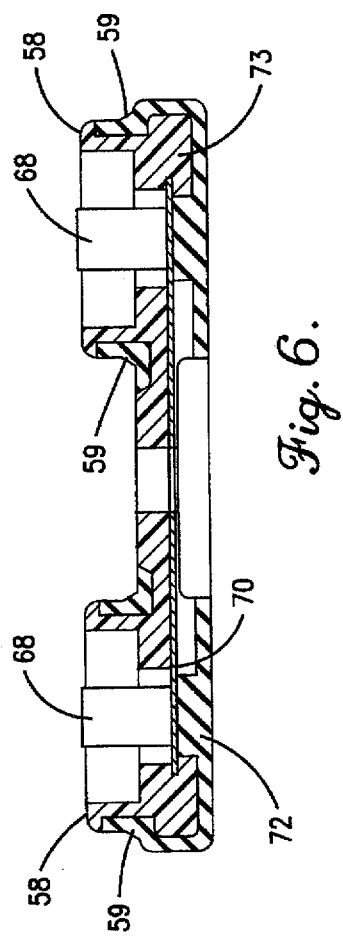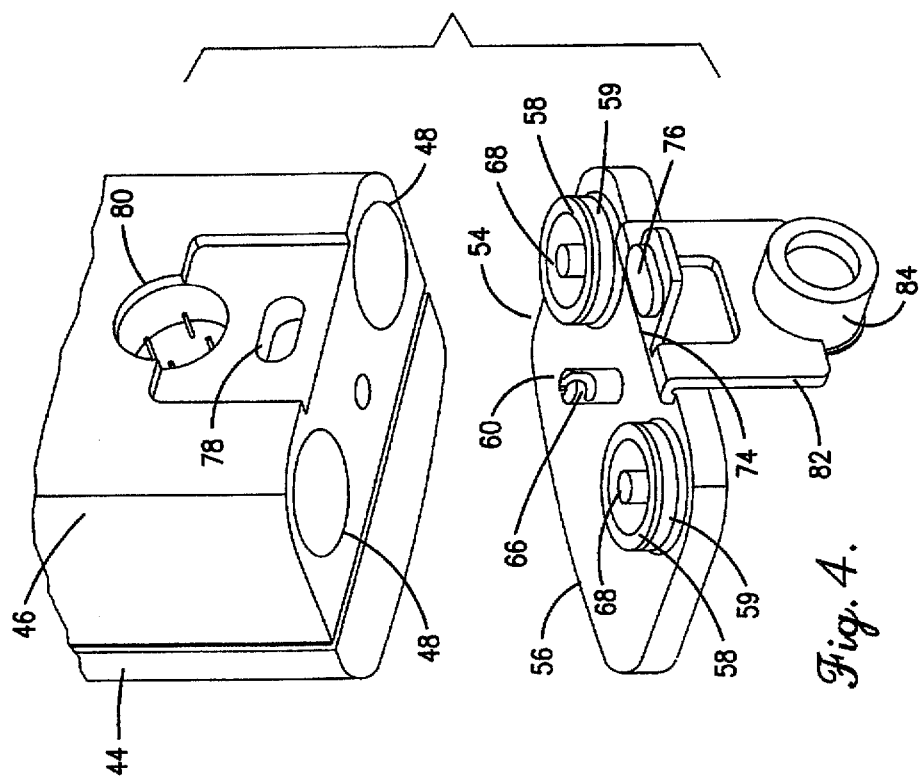

ERGONOMIC HAND-HELD ELECTRONIC DEVICE WITH KEYPAD INPUT AND DISPLAY SCREEN

This is a continuation of application Ser. No. 08/305,167, filed Sep. 13, 1994, now abandoned.

TECHNICAL FIELD

The present invention relates in general to hand-held electronic devices having keypad inputs and display screens. In particular, the present invention relates to an improved housing arrangement providing component sealing, easy grasping in a hand, and ergonomic arrangement for the input and display.

BACKGROUND ART

There are numerous examples of hand-held electronic devices which include a housing surrounding internal circuitry and a battery power supply. The housing also mounts an input, typically a keypad, and a display screen output. Examples include calculators, navigational aids such as global positioning systems, video games, inventory tracking equipment, etc. These devices are often held in one hand while the other hand is used to operate the input, such as by pushing the keys of the keyboard.

With miniaturization of components, the size of such devices (i.e. height, width and thickness) is often not determined by the internal components, but by human factors. In other words, the housing may be larger than strictly necessary to house the internal components. This is to allow the input to be of a size easily used by human fingers, the display screen to be of a size easily read by the human eye, and the overall housing to be of a size and shape easily held in the human hand. With increased computing power available through contemporary integrated circuits, the display screen is more and more a relatively large graphics display, rather than the previous 8 to 10 digit display.

Despite this relative freedom of design, prior art hand-held devices have been awkward to operate. As noted above, they were often used by holding the device in one hand while operating the input with the other hand. However, it is often desirable to hold and operate such devices with a single hand, to free the other hand for another task. Where this is the case, the user supports the device from behind with the fingers and outer end of the palm, with the thumb wrapped about the device. In this manner the heel of the palm serves to clamp the device to the hand, and the thumb may be used to operate the input.

While this is serviceable, this often results in unstable and awkward use. First, in many prior art devices the various faces forming the rectangular device are connected by small radius curves, such that relatively sharp corners are formed. This make the devices relatively difficult and uncomfortable to hold in the hand. Second, while these devices have a width which permits them to be held in a single hand, they are often too wide to permit the thumb to reach fully across the input while held securely in the hand. This renders the device unusable with a single hand, or forces the user to hold the device in an unstable manner.

Finally, it is a standard arrangement to mount the screen vertically above (with respect to the user's vision) the input. As noted above, for single-handed operation the device must be located in the hand with the input adjacent the thumb for operation. Since many devices have a height and width which is nearly fully occupied by the input and display, this typically results in a much larger portion of the device extending outwardly above the fingers (in the generally vertical direction) than extends below the thumb across the fingers. This can cause an unstable arrangement, with it being difficult to maintain the device secure with only the fingers and heel of the palm.

Beyond these factors, prior art devices have often been rather delicate, in that they have not been sufficiently weatherproofed. This of course limits their applications. The housing of prior art devices have employed two or more main shell sections which are secured together. Providing seals between these shell sections has been relatively straightforward. However, these devices also carry battery power supplies which must be accessible to the user. Prior art arrangements have resulted in battery storage compartments having relatively large covers, which in turn require relatively large seals. Such relatively large seals are difficult to maintain throughout the life of the device.

DISCLOSURE OF INVENTION

An object of the present invention is to provide an electronic device which is more securely held in one hand in an operating position.

Another object of the present invention is to provide an electronic device which may be more easily operated with one hand.

Yet another object of the present invention is to provide an elongated device in which the rear of the device is partially rounded for comfort.

Another object of the present invention is to provide an electronic device in which the housing has an elongated, relatively narrow configuration.

A further object of the present invention is to provide an electronic device having a display screen elongated in the vertical direction.

Yet another object of the present invention is to provide an electronic device in which the electronic keypad input is located vertically above the display screen.

A further object of the present invention is to provide an electronic device which may be effectively weatherproof.

Yet another object of the present invention is to provide an electronic device which has a relatively small seal area for a battery compartment.

A further object of the present invention is to provide a battery compartment cover which is easily constructed and easily sealed, and yet forms a section of the power circuit.

These and other objects are achieved by an ergonomic and weatherproof hand-held electronic device. The device includes a housing which surrounds internal electronics. An input and a display screen are mounted to be accessed at the exterior of the housing. The housing is elongated and has a relatively narrow width such that, when held in a human hand, the thumb of that same hand may extend fully across the input for full access. The display screen is mounted vertically below the input such that the device may be more stable and more easily grasped. The device operates upon cylindrical batteries, and includes two cylindrical cavities to receive the batteries. The cavities are located at the rear vertical edges of the housing such that the rear of the housing is relatively rounded and thus easier to grasp. The battery cavities open to the exterior of the housing. A battery cover is mounted to the housing and seal the cavities. A contact for each cavity is located on the cover, and a bus bar extends between the contacts to complete the circuit between the batteries in the two cavities.

BRIEF DESCRIPTION OF DRAWINGS

The objects and features of the invention noted above are explained in more detail with reference to the drawings, in which like reference numerals denote like elements, and in which:

FIG. 4 is an exploded perspective view of the attachment of the battery cover;

FIG. 5 is a top view of the battery cover; and

FIG. 6 is a cross-sectional view along line 6—6 of FIG. 5.

MODES FOR CARRYING OUT THE INVENTION

Figure 1:
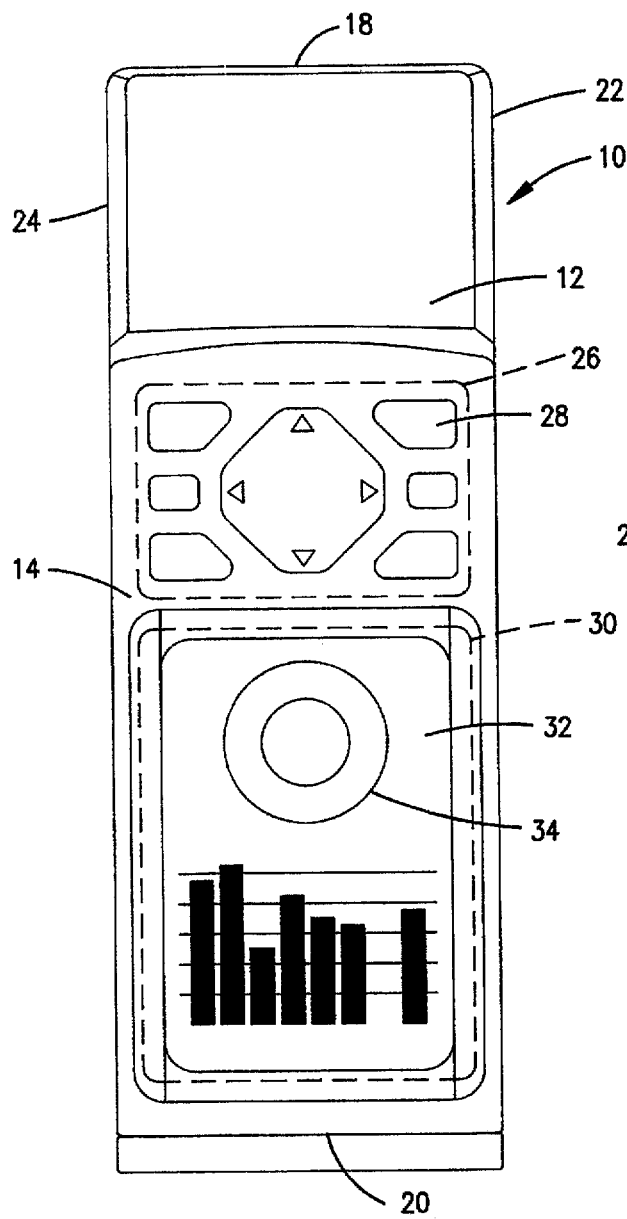
FIG. 1 is a front view of a device according to the present invention.

With reference to FIG. 1, a hand-held electronic device according to the present invention is generally designated by reference numeral 10. The device 10 includes a housing 12 which may take many geometric forms, but in the preferred embodiment takes the form of a generally rectangular block. As such, the housing 12 defines a front face 14, a rear face 16 (FIG. 2), top and bottom faces 18 and 20, and right and left faces 22 and 24. The device 10 may of course be operated in various spacial orientations, but regardless of the global orientation, the device will be operated with the top face above the bottom face, with respect to the vision of the user, and with the front face facing the user. As such, the direction from the bottom face toward the top face will be referred to as vertically upward, with other directional references proceeding therefrom. This will also define a height between the top and bottom faces, a width between the right and left faces, and a depth or thickness between the front and rear faces.

The front face 14 of the housing 12 defines an input area 26 accessible from the exterior of the housing. Located within the (imaginary) confines of the input area 26 are one or more input devices 28. In the present embodiment several input devices in the form of buttons are provided. The front face of the housing also defines an output area 30 accessible from the exterior of the housing. The output will consist of an optical display, and in the present embodiment is an LCD screen 32 capable of displaying various graphic images 34.

The housing 12 defines an interior space 36 within the confines of its various faces. Located within this interior space are various printed circuit boards (PCBs) 38 mounting various electronic components 40 (FIG. 2), as is generally known in the art. These components will of course vary with the particular application to which the device 10 will be put, and the components are operatively connected to the input device(s) 28 and display screen 32. To power these components, there are several batteries 42 located within the space 36. The circuitry for these components will be discussed in more detail later.

A first important object and feature of the device 10 is the ability to be easily used with one hand. In particular, the device 10 will be held in the hand with the rear face 16 (or at least a hand-hold portion of the rear face 16) resting upon the a portion of the palm and fingers of the user. The fingers will wrap about the housing such that the free ends of the fingers wrap about a side face (right or left, depending upon the handedness of the user). The free ends of the fingers may or may not further wrap about the device to rest upon the front face of the housing.

The thumb of the user will then extend across the front face 14 (or, again, at least across a hand-hold portion of the front face), such that the heel of the palm and the fingers serve to clamp the device in the user's hand. While this is common in hand-held electronic devices, with the present device 10 the thumb of the user must be able to easily access the entirety of the input area 26 when the device is held. To achieve this, the device (or a hand-hold portion of the device) must of course have a width and depth falling within a certain range, the input area must have a height and width falling within a certain range, and the input area must be located on the device in a certain range of positions.

These various ranges are of course necessary due to variations in sizes and flexibility of the human hand. In general, the ranges will encompass all configurations in which the device may be held in one hand with relative ease, while the entire input area is accessible to the thumb of that same hand. With more particularity, the ranges may be bounded by approximately 65 mm in width and 80 mm in height. In the preferred embodiment, and by way of example, the device 10 may have a width of approximately 50 mm (2 inches), and a depth of approximately 30 mm (1.2 inches), while the input area 26 has a width of approximately 40 mm (1.6 inches) and a height of approximately 25 mm (1 inch). It may be seen from these preferred dimensions that the width of the input area substantially corresponds to the width of the device, such that placement of the input area on the front face is not critical, and it may be simply centered.

The size (i.e. height and width) of the display area will vary with the needs of the particular application, and this display area will typically correspond to the outer periphery of the display device. A standard six to ten digit numeric display may be sufficient for some uses. However, contemporary electronics permits sufficient calculations that graphical displays may be employed, and these are preferred. Any standard display may be employed, with electro-optical displays being preferred, and LCD displays most preferred.

The size of such graphical displays (and thus the display area), may also vary depending upon the particular application and the display characteristics of the particular display device. The size of the display area may be appreciably larger than that of the input area, but in the preferred embodiment with the generally rectangular housing, the width of the display area is approximately the same as that of the input area, and is again centered on the front face. The height of the display area is of course not constrained in the same manner, and in the preferred embodiment the display area and display device are elongated in the vertical direction. The preferred display is an approximately 65×100 pixel LCD display having a diagonal measurement of between 50 and 120 mm (2 to 4.5 inches).

The object and feature of one-handed operation is further enhanced by the relative locations of the input and display areas. In particular, in the present device the input area is located vertically above the display area, opposite to the arrangement of the prior art.

Placing the display area below the input area greatly stabilizes the device within the user's hand. Specifically, it is recalled that the input area is located so as to be fully accessible by the thumb. When held before the face of the user, the thumb of this holding hand is located at the upper edge of the hand. As such, the input area will be located adjacent the upper edge of the hand when in use.

Since most hand-held electronic devices have front faces which correspond to the combined sizes of the input and display, location of the display area above the input, as in the prior art, results in the majority of the device extending above and beyond the user's hand. This is of course detrimental to a stable grasp on the device, since only a small portion of the device would be within the user's grasp while an appreciable (and often heavy) portion of the device is unsupported.

In the arrangement of the present invention, however, this is avoided. The placement of the display below the input assures that a greater percentage of the height of the device extends downward from the upper edge of the hand and rests within the grasp of the user. This effect is of course most apparent in devices in which the front face is substantially comprised of the input and display. However, even where the front face has appreciable areas unused by the input and display, the present inverted arrangement assures more of the device will be located in the user's grasp, improving the stability of the device in the hand.

Another object and feature of the present invention is to provide greater comfort and stability by providing a more rounded configuration to the rear of the device. Many prior art hand-held devices have relatively sharp corners between the side and rear faces. As may be appreciated, a more rounded configuration would more readily conform to the human hand.

Such a rounded configuration could of course be achieved by simply forming the noted edges with larger radii. With standard prior art arrangements of the internal components and batteries, however, this would require enlarging the housing to accommodate the larger radius edges, wasting internal space and quite possible making the device too large to be comfortably held. In the present invention a unique arrangement of the batteries provides an excellent opportunity to provide well rounded edges while providing an efficient use of internal space.

Figure 2:
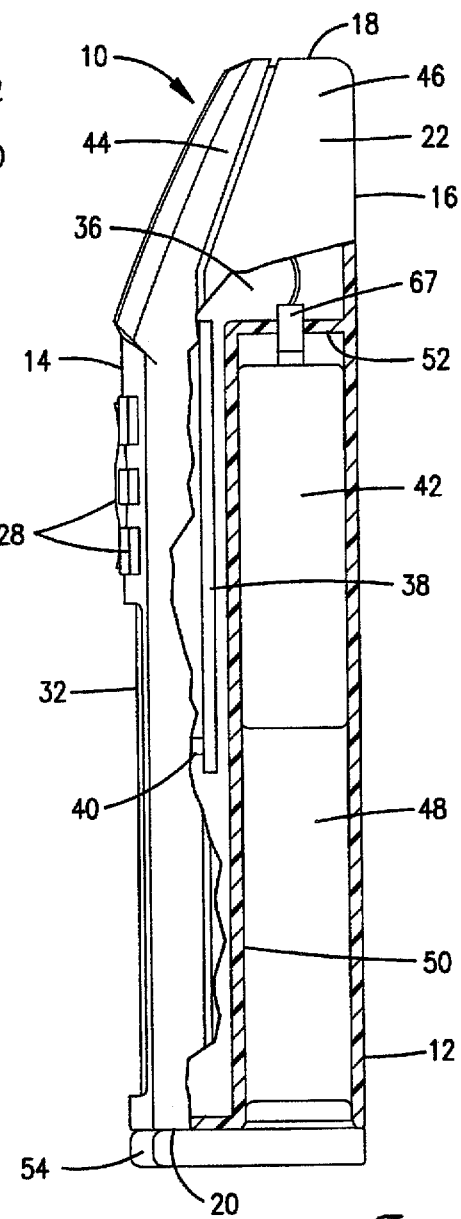
FIG. 2 is a side view, in partial cut-away, of the device of FIG. 1.
Figure 3:
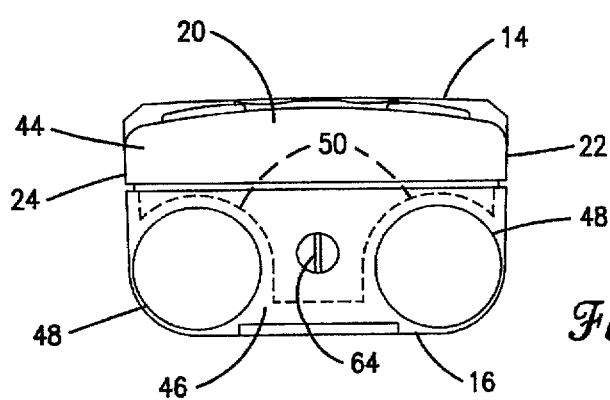
FIG. 3 is a bottom view, with the battery cover removed, of the device of FIG. 1.

With reference to FIGS. 2–4, the housing 12 may be seen to be formed of front and a rear shell section 44 and 46, as is known in the art. The front shell section 44 comprises the front face 14 and a portion of the top, bottom, and side faces. The rear shell section 46 comprises the rear face and the remaining portion of the top, bottom and side faces. It is this rear shell section which is provided with a pair of battery cavities 48.

As best shown in FIG. 3, the rear shell section 46 (and the front shell section for that matter) is a generally concave member formed of the associated faces of the housing. A cavity side wall 50 extends from each of the side faces 22 and 24 and connects to the rear face 16. The side wall 50, together with the intervening sections of the rear and side faces form the cylindrical cavities 48. A generally planar end face 52 is located at an upper or interior end of each cavity, and will be discussed more fully below. The battery cavities have longitudinal axes aligned in the vertical direction. As may be seen, the cavities are sized to receive appropriate cylindrical, commercially available batteries 42. In the preferred embodiment two such batteries will be located in each cavity 48, in known end-to-end relation.

As is best shown in FIG. 3, each of the cavities is located at an intersection of the rear face 16 and an associated side face 22 or 24. As such, the housing may readily take the radius of the cavity, which is relatively large. The radius will of course depend upon the particular battery size, but in the preferred embodiment the cavities are sized for use with AA batteries, and provide a very sufficient and comfortable rounding at these edges.

As may be envisioned, the spacing between the cavities 48 will depend upon the overall width of the device. For most practical applications, there will be an appreciable distance, at least in terms associated with assembly of electronic devices. As such, there will typically be sufficient space between the side walls 50 of the cavities 48 to locate PCBs, components, etc., such that the interior space 36 is efficiently used.

A further advantage from this placement of the batteries is in sealing or weatherproofing of the device 10. It is known in the prior art to seal the edges of the housing shell sections, such as 44 and 46, to prevent in the ingress of dust and water, or even air. However, the user must still have ready access to the batteries for replacement, and as such a cover and associated seal is necessary for the battery compartment. The covers for such battery compartments in the prior art have had relatively large and complex peripheries, such that sealing over the life of the device has been difficult.

The placement of the batteries and battery cavities in the present device provides a simple and reliable seal arrangement. In particular, each of the battery cavities 48 opens individually onto the bottom face 20 of the housing. There is therefore needed only a simple circular seal for the cavity openings. To provide this seal, the device 10 also includes a battery cover 54.

The battery cover 54 is a generally planar (or other configuration to conform to the bottom face) member, which in the preferred embodiment has a peripheral configuration corresponding to the bottom face. The cover 54 has a top face 56 adapted to abut against the bottom face of the housing when the cover is in the closed position. The cover 54 should therefore technically be included as a portion of the housing, but for clarity this distinction will be maintained.

The top face of the cover includes two circular protrusions 58 located such that they correspond to the openings of the battery cavities in the closed position. A suitable elastomeric seal material 59, such as rubber, is located at least on the outer periphery of the protrusions such that the elastomeric material will engage with the edges of the battery cavities and provide a water-tight seal.

The cover of course needs some means to secure it in the closed position, and any well-known latch arrangement may be employed. In the preferred arrangement a locking pin 60 extends through the cover at a central location, and may rotate with respect to the cover. The bottom face 20 of the housing includes a closed pin cavity (not shown) which will receive the pin. Secured across the cavity is a locking rod 64 (FIG. 3), and the pin 60 includes a tortuous groove 66 which may receive the pin. As is known in the art, rotation of the pin after receipt of the rod 64 therein will cause the pin, and thus the cover, to be retained securely in place. A appropriate handle (not shown) may be provided on the pin to assist in the manual rotation of the pin.

As may be seen, this will provide an effective seal for the battery cavities. However, the batteries 42 are not operatively connected to the components of the device. To remedy this, the end faces 52 of the battery cavities are provides with first contacts 67 (FIG. 2), which are preferably molded into the housing or provide with other seal arrangements. Within each of the protrusions 58 on the cover 54 there is also located a second contact 68.

These second contacts are electrically connected within the cover 54 to complete the electric circuit. With reference to FIGS. 5 and 6, the connection between the second contacts 68 is preferably formed by an electrically conductive plate 70. This plate has electrically insulating material 72 in covering relation (preferably by molding over the plate), except at the two points where the second contacts extend. In the most preferred embodiment, the conductive plate has insulating plastic molded 73 thereabout to form a majority of the cover and the protrusions. Thereafter, the elastomeric material 59 is molded over the plastic at least about the protrusions, and preferably about the majority of the cover.

With this arrangement the batteries may be place in their respective cavities with opposite poles extending from the cavities, and the cover will serve to complete the circuit. The cavities are also effectively sealed against the elements by the cover, such that the interior of the housing is effectively protected.

As the cover 54 is intended to be periodically removed, it is preferred that there be some arrangement to retain the cover with the device to avoid losing the cover. To this end, the elastomeric material preferably surrounding the cover may additionally form an extending hinge retainer 74. The hinge retainer is a cantilevered extension of the elastomeric material, such that its free end may be secured to the housing, as by a screw. This will permit movement of the cover between its open and closed position, but will retain the cover with the device. To maintain proper alignment of the cover the free end may be provided with a hinge block 76 which is received within a mating cavity 78 in the rear face (FIG. 4).

Hand-held electronic devices also often include a connection point for external power supplies, equipment, etc. In the present device there may be provided such an outlet 80. To improve longevity of the device, it is preferred that this outlet be provided with a protective cover against the elements. To this end, the cover 54 for the battery cavities is also provided with an outlet extension 82 formed of the covering elastomeric material. As with the hinge retainer, the outlet extension is formed as a cantilevered element having a plug 84 at its free end, with the plug sized to be sealingly received within the outlet 80. In this manner, the cover 54 will provide sealing to the battery cavities, will be retained with the device, and will provide protection for an external connection outlet.

We claim:

1. In a hand-held electronic device including a housing having exterior faces, the improvement comprising:

one of said faces having a pair of battery cavities opening thereon, said cavities each having a cylinder, with longitudinal axes of said cylinders not being within a plane of said one of said faces, and further including a cover constructed and arranged to close said cavities, said cover including a contact constructed and arranged to operatively associate with an associated one of each of said cavities, and said contacts being electrically connected, wherein said housing further includes an outlet for connection of external devices, said cover including an outlet extension formed of elastomeric material received sealingly in said outlet.

2. The improvement of claim 1, wherein said housing faces include spaced front and rear faces, and side faces extending between said front and rear faces at lateral edges thereof, and wherein longitudinal axes of said cylinders are parallel to said lateral edges, said cylindrical cavities being located at, and defining, the intersecting edges of said side faces and said rear face, whereby said intersecting edges are rounded in conformity with said cylindrical cavities.

* * * * *